United States Patent [19]

Hayes et al.

[11] Patent Number: 4,795,880
[45] Date of Patent: Jan. 3, 1989

[54] LOW PRESSURE CHEMICAL VAPOR DEPOSITION FURNACE PLASMA CLEAN APPARATUS

[76] Inventors: James A. Hayes, 7530 Hihn Rd., Ben Lomond, Calif. 95005; John T. Davies, 5610 Circle Dr., El Sobrante, Calif. 94803

[21] Appl. No.: 166,775

[22] Filed: Mar. 7, 1988

Related U.S. Application Data

[63] Continuation of Ser. No. 906,343, Sep. 11, 1986, abandoned.

[51] Int. Cl.$^4$ ............................................. B23K 9/00
[52] U.S. Cl. .................... 219/121.52; 219/121.43; 219/121.4; 219/121.36; 219/121.54; 315/111.51; 156/345
[58] Field of Search ................ 219/121 PG, 121 PD, 219/121 P, 121 PR, 121 PT, 121 PX, 121 PW, 76.16; 315/111.51; 156/345; 313/231.31, 231.41, 231.51

[56] References Cited

U.S. PATENT DOCUMENTS

| | | | |
|---|---|---|---|
| 3,296,410 | 1/1967 | Hedger | 315/111.51 |
| 3,432,296 | 3/1969 | McKinnon et al. | 219/121 PR |
| 3,958,883 | 5/1976 | Turner | 315/111.51 |
| 4,430,547 | 2/1984 | Yoneda et al. | 219/121 PG |
| 4,629,940 | 12/1986 | Gagne et al. | 315/111.51 |

Primary Examiner—M. H. Paschall
Attorney, Agent, or Firm—Nathan N. Kallman; Alan H. MacPherson; Paul J. Winters

[57] ABSTRACT

Cleaning of low pressure chemical vapor deposition (LPCVD) furnaces is accomplished "in-situ" at furnace operating temperatures. Radio frequency (RF) power is coupled into reactive gases, that have been metered into the evacuated furnace tube, using the furnace heating coil as the coupling element so as to create an etchant gas plasma. The gas chemistry and plasma conditions are selected to remove the LPCVD film that has accumulated on the furnace quartzware surfaces during its use in the LPCVD film deposition mode. The volatile chemical byproducts of the plasma clean reaction are removed from the furnace tube by the system's vacuum pump.

17 Claims, 4 Drawing Sheets

LOW PRESSURE CHEMICAL VAPOR DEPOSITION FURNACE PLASMA CLEAN APPARATUS

This application is a continuation of application Ser. No. 906,343, filed Sept. 11, 1986, now abandoned.

BACKGROUND OF THE INVENTION

1. Field of the Invention

This invention relates to equipment designed for "in-situ" cleaning of low pressure chemical vapor deposition (LPCVD) furnace quartzware at furnace operating temperatures.

2. Description of the Prior Art

As integrated circuits continue to increase in complexity, films formed by LPCVD occur frequently in the fabrication process. Many of these films are deposited in a furnace type of LPCVD system. While such systems produce uniform films very economically, the "hotwall" system suffers from a film buildup on the furnace quartzware. The film can break loose during the process causing unacceptably high levels of particulate contamination non the wafer surface. To overcome this problem frequent cleaning of furnace quartzware is necessary to achieve and maintain high semiconductor product yields.

To maintain the required levels of cleanliness in furnace LPCVD systems, current practice involves physically removing the quartz tube and wafer boat, allowing them to cool, soaking them in an acid bath, rinsing them with DI water, drying them, reinstallation, thermal stabilization, leak checking and process requalification. The whole process can take several hours during which time the system is inoperable for wafer production.

Alternatively, the "dirty tube" is replaced by a previously cleaned tube but two to three hours are still involved in reestablishing the furnace temperature profile, leak checking the sytem and performing a test run to ensure that tube changing has not altered film deposition conditions.

While practice varies, depending on company experience and product complexity, the cleaning process is typically performed after a 5 micron film buildup, which occurs after 10 to 20 deposition hours of polysilicon and silicon nitride, respectively. With a conservative "inoperative time" estimate of 2 hours (and it is often much longer), this translates into a 10% to 20% loss of useful processing time.

In addition to this "productivity penalty" there are costs associated with labor, high purity chemicals and the "wet clean station" required. There is also the chance of breaking the expensive quartzware and there are hazards involved with acid use and disposal.

In-situ plasma cleaning of LPCVD furnace tubes has numerous advantage in view of the fragility of the quartz apparatus involved. Convenience is also important since it is advantageous to perform the clean frequently to avoid heavy tube wall film buildup that will flake and cause wafer contamination. It is further desirable to use existing parts of the LPCVD equipment as far as possible to minimize added clean function expense.

Gas plasma "dry cleaning" offers these advantages provided a reliable means of introducing the plasma can be created.

At present there is only one commercially available "dry cleaning" system utilizing a gas plasma for "in situ" tube cleaning. It comprises a long electrode structure, suitably supported to permit insertion into an empty furnace tube. Appropriate pressure levels and gas flows are established and the electrodes are powered from an external source to provide a gas plasma that cleans the tube. The wafer boat and internal boat support structures can not be cleaned due to the presence of the electrodes.

The unit is bulky and interferes with the operation of the other tubes in the furnace bank while being used. "Setup" requires operator involvment. There is the possibility of quartzware contact damage and contaminant introduction from the fabric of the inserted electrode.

SUMMARY OF THE INVENTION

In accordance with this invention, an apparatus for in-situ cleaning of LPCVD furnace quartzware employs the furnace coil, auxiliary coil or capacitive electrode as RF power coupling elements to produce an etchant gas plasma. In one embodiment, as auxiliary coil and capacitive coupling element are coupled to the radio frequency power supply to provide electrical isolation between the radio frequency power supply and the furnace power supply. In another embodiment, an auxiliary capacitive electrode and an inductive coupling element are coupled to the RF power supply to provide electrical isolation between the radio frequency power supply and the furnace power supply. In other implementations, an auxiliary coupling element is provided in the furnace power supply circuit with means for electrically isolating and blocking induced radio frequency power from the furnace power supply. The electrical assembly becomes an integral part of the furnace system, making frequent use practical. No aisle space is consumed and other tubes can be used while one is being cleaned. By eliminating the need for an inserted electrode, both wafer boat and tube cleaning occur simultaneously with no change of physical damage or degradation due to contaminants.

The proposed invention consists of four basic subsystems: (1) a simple RF power supply with frequency and power level chosen to efficiently energize the reactive gas and minimize sensitivity to changes in gas plasma conditions; (2) interface elements comprising a metching/blocking components or a switching arrangement to avoid undesirable interactions between the furnace and RF power supplies, while effectively coupling the RF energy into the coupling element. In one implementation, a tuning control is used to adjust the matching of the RF power into the gas plasma and compensate for variations in the electrical parameters associated with different coupling elements and plasmas; (3) a gas source and flow and pressure control system designed to meter the required amount of selected gases into the furnace reaction tube and maintain the specified flow and pressure level for a certain period of time; and (4) an overall process sequence control unit which initiates the evacuation process, activates the reactant gas introduction when a certain vacuum level is reached, turns on the RF power when the correct reactant gas pressure is attained, turns the RF power and reactant gas flow off when the cleaning cycle is complete, purges the system with nitrogen and vents the system back to atmospheric pressure. This unit could be operated in a "local" control mode or in a "remote" mode receiving control signals from the LPCVD system's microprocessor and pressure sensors.

The cleaning time may be predetermined or controlled by a signal from an "end of process" detector which monitors the chemical state of the gas plasma and terminates the etching process when the clean is complete.

BRIEF DESCRIPTION OF THE DRAWINGS

Similar numerals refer to similar elements throughout the drawings.

DETAILED DESCRIPTION

Figure 1:
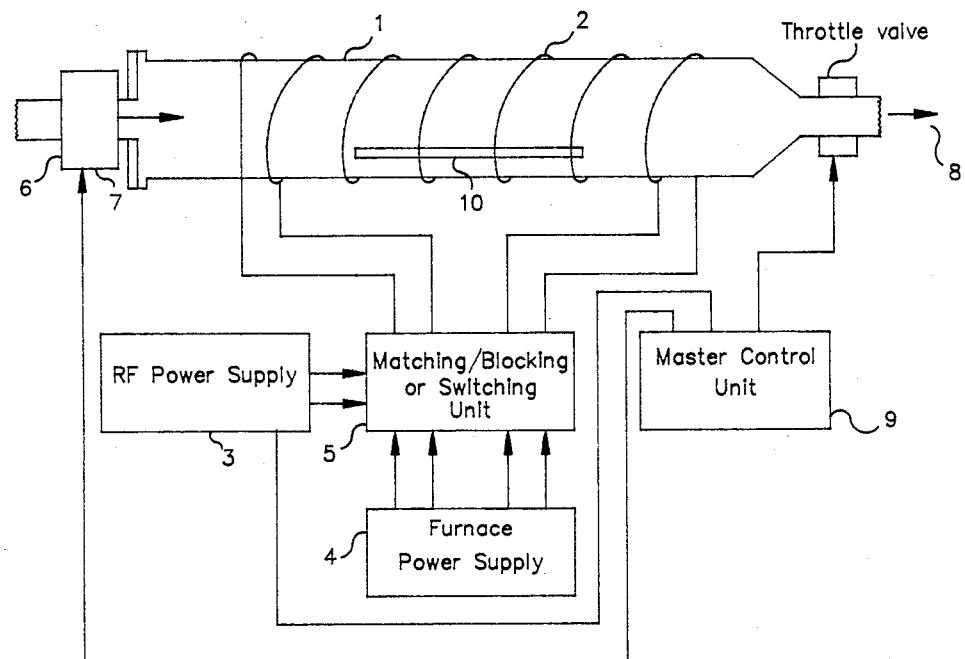
FIG. 1 is a schematic illustration of the novel system showingn the way in which the various subsystems are interconnected and coupled to the furnace LPCVD system.

FIG. 1 shows a typical furnace tube 1 surrounded by a heating coil 2. In this implementation, the ends of the coil are attached to an RF supply 3 and a furnace supply 4 via a matching/blocking or switching element 5. The frequency of the power applied to achieve RF breakdown in an etchant gas 6 must be high enough to couple across any air cap and through the quartz and create a sufficiently high electric field in the gas by either inductive or capacitive coupling. In cases where a coil coupling element is used, the current in the coil must also be high enough to sustain the gas breakdown and since the coil's inductance is fixed, its impedance rises with feuqency which limits the current, unless the coil's inductance is tuned out by a capacitive impedance. Such tuning is only possible below the self-resonant frequency of the coil assembly.

The gases required for cleaning and purging purposes enter one end of the furnace tube through a gas control unit 7. They are exhausted at the other end of the furnace tube by a vacuum pump 8. Both the gas control unit and the RF power supply operation are controlled by a master control unit 9. During the cleaning cycle, the wafer boat 10 is placed in the furnace so that it is also cleaned.

Figure 2A:
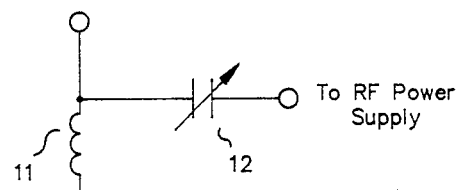
FIGS. 2a-2c are schematic representations of components and interconnections utilized in the matching/-blocking or switching unit of this invention.
Figure 2B:
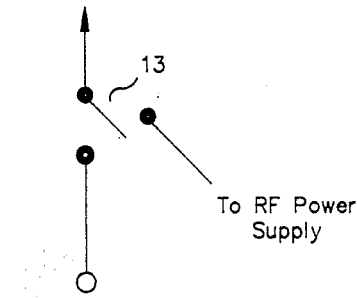
Figure 2C:
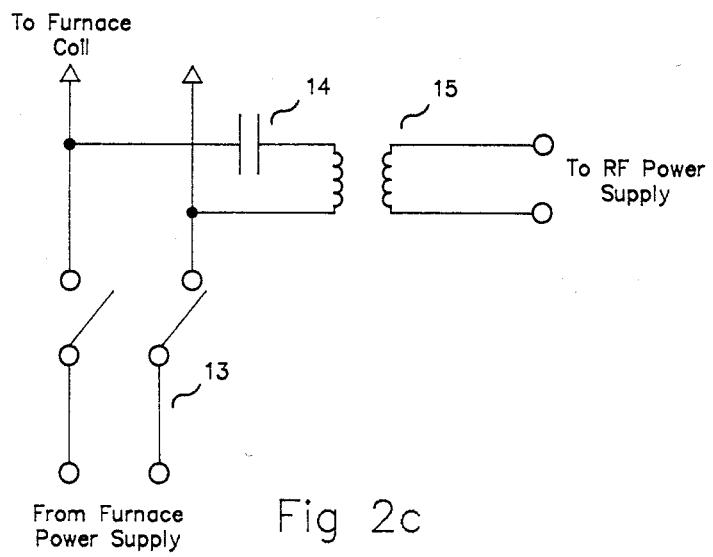

FIGS. 2a, 2b and 2c show possible matching/blocking/switching elements which isolate the power supplies when the furnace coil is used as the coupling element. FIG. 2a shows a variable capacitor 12 which offers a very large impedance to th furnace power supply frequency (typically 50-60 Hz) but a much lower impedance to the RF power (typically above 300 kHz). This prevents the furnace operating power from entering the RF generator. Further, the capacitor may be selected to resonate with the inductive coil 11 to the RF supply, thereby improving RF generator power matching. Similarly, the inductance 11 blocks RF power from entering the furnace power supply but does not hinder furnace heating. FIG. 2b shows a simple switching device whereby either the RF power supply or furnace power supply can be connected to the furnace but never to each other. FIG. 2c shows a combination whereby the heating power is interrupted by a heavy duty switching element 13 synchronized to opposite switching of the RF supply but with the matching capacitance 14 retained. Also shown is an impedance matching transformer 15 which improves RF coupling and high frequency efficiency and further reduces the furnace power/RF generator coupling.

Alternative embodiments of the invention are illustrated in FIGS. 5-9. In these embodiments auxiliary elements are provided whereby direct connection between RF power and the furnace coil is avoided, and induced voltages caused by the RF energy are prevented. The auxiliary elements can be supported by a quartz tube to which they are attached.

Figure 5:
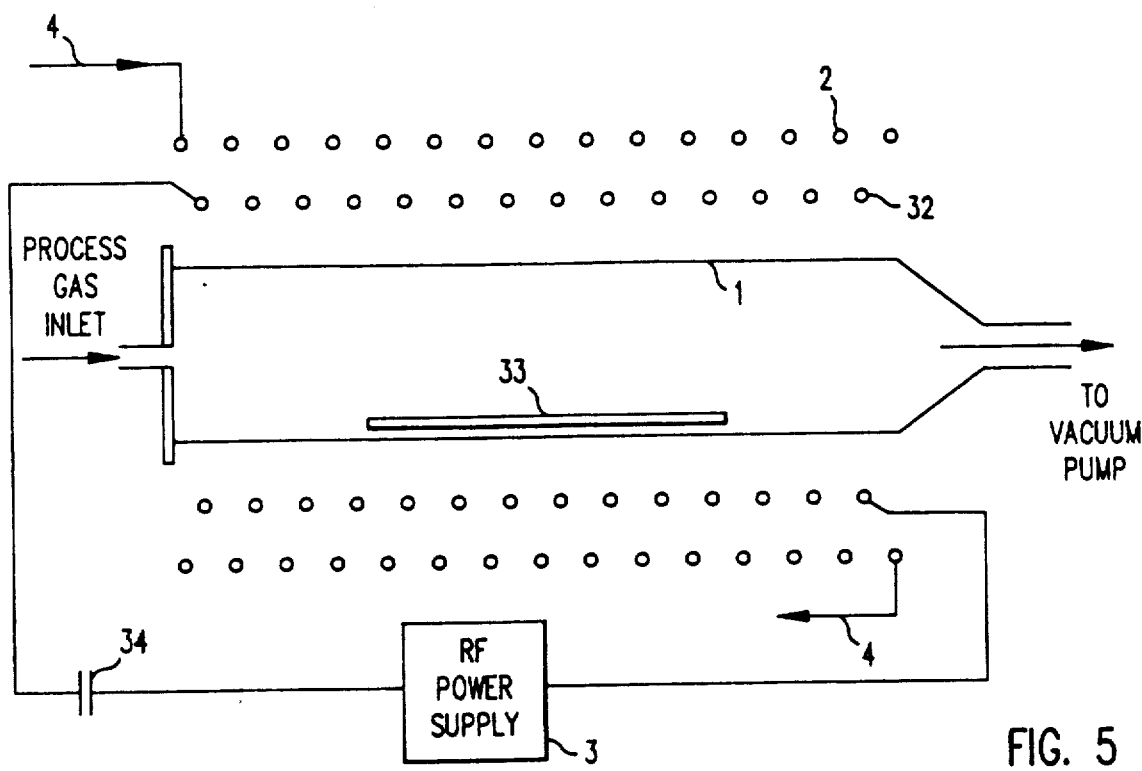
FIGS. 5 and 6 are schematic representations of alternative embodiments of this invention, in which coil or capacitive elements are coupled to the RF power supply.

In FIG. 5, an auxiliary coil 32 couples radio frequency energy to the furnace tube 1, and a capacitive element 34 is connected between the coil 32 and the RF power supply 3. A wafer boat 33 on which semiconductor wafers would be processed is seated as illustrated. The capacitive element 34 and auxiliary coil 32 are selected preferably to form a resonant circuit that is tied to the RF power supply 3. The auxiliary coil 32 is electrically isolated from the furnace power supply 4. The auxiliary coil is preferably made of an electrically conductive, nonmagnetic material formed of nickel, iron, chromium and magnesium, in which the nickel content is about 72%, such as Iconel 600. The use of such an auxiliary coil material relieves the operating temperature requirements so that the apparatus is not limited to a specified operating temperature or by the Curie temperature of the furnace coil material.

Figure 6:
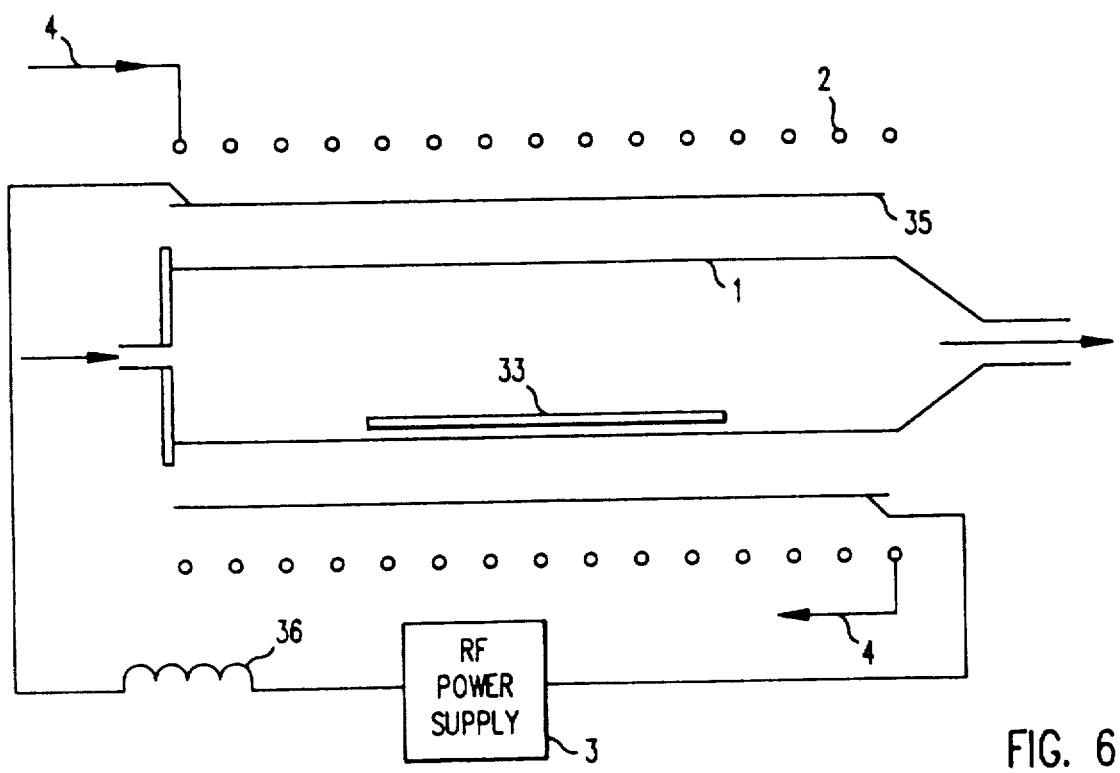

In FIG. 6, an auxiliary capacitive electrode 35 is provided adjacent to the furnace tube 1. An inductive element 36 couples the electrode 35 to the RF power supply 3. The RF power supply 3 is electrically isolated from the furnace power supply 4. The values of the capacitive electrode 35 and the inductive electrode 36 are selected preferably to form a resonant circuit with the RF power supply 3.

Figure 7:
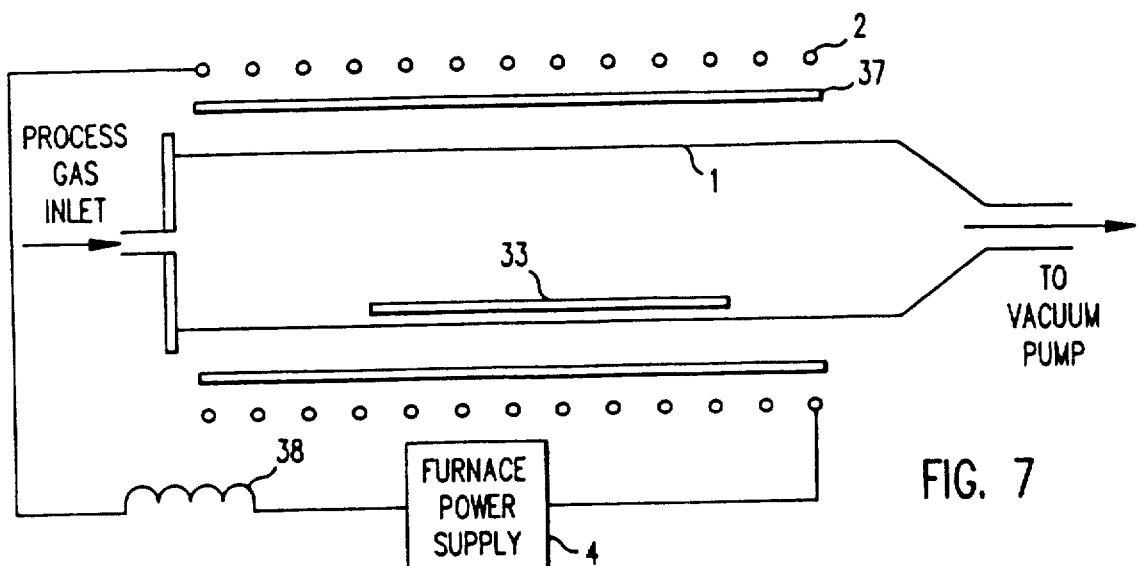
FIGS. 7-9 are schematic representations of alternative embodiments employing an auxiliary coupling element with a blocking or shielding element to block induced RF energy from the furnace coil.
Figure 8:
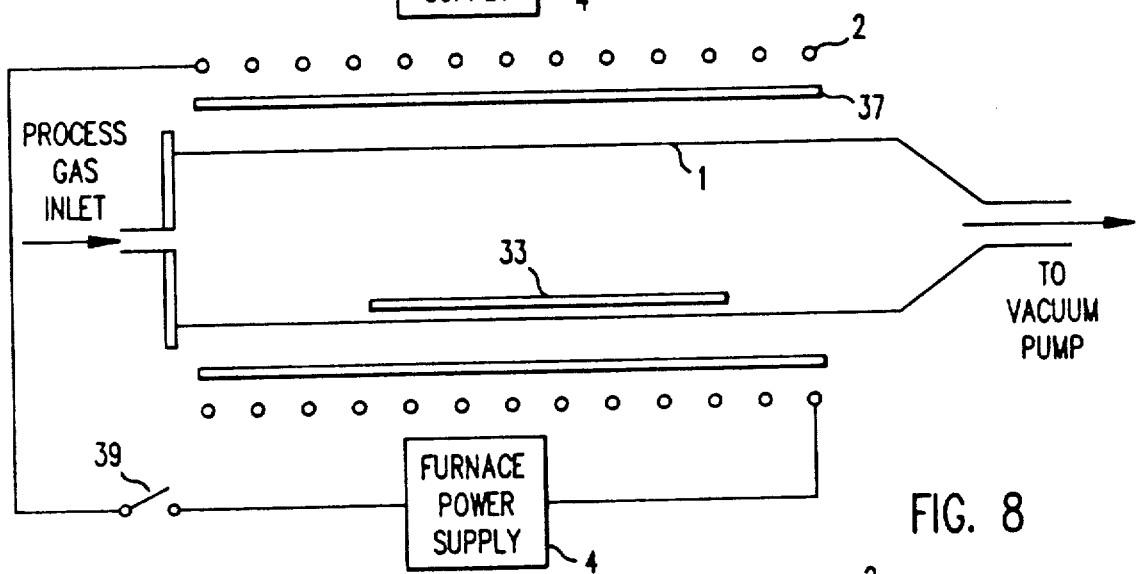
Figure 9:
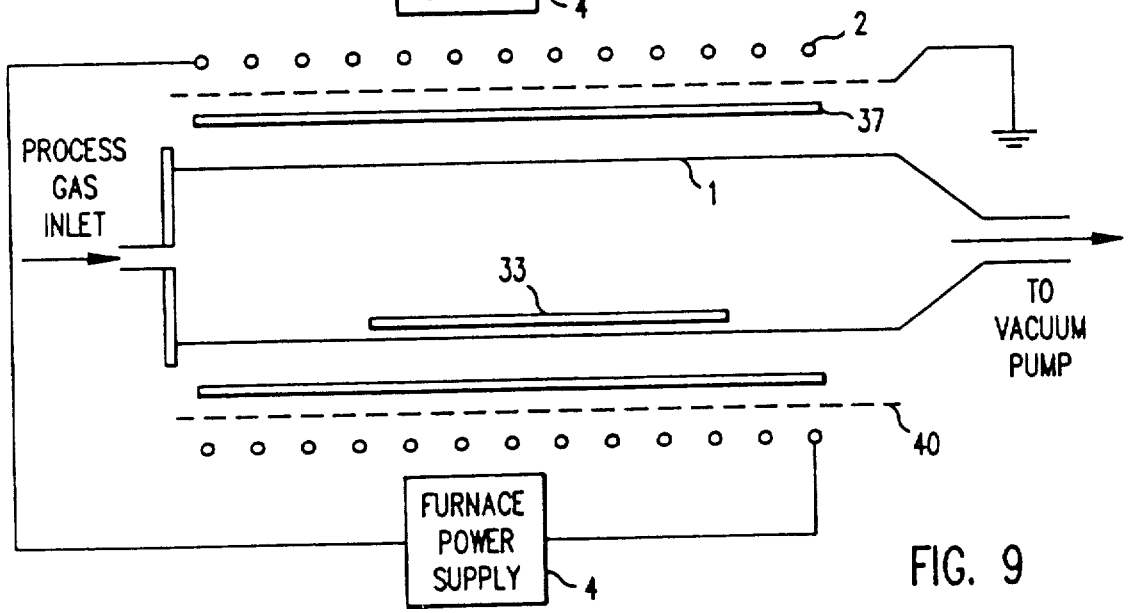

In FIG. 7, an auxiliary coupling means 37 is located adjacent to furnace tube 1, and an inductive element 38 is connected between the furnace power supply 4 and the furnace coil 2. The coupling means 37 is preferably a capacitive element. The inductive element 38 blocks RF energy from appearing at the furnace power supply 4. In FIGS. 7, 8, and 9 the RF power supply 3 and its connections to the auxiliary elements are not shown for the purpose of convenience.

FIG. 8 illustrates an apparatus wherein a switching element 39 is used to disconnect the furnace power supply 4 from the furnace coil 2 whenever RF power is used. The auxiliary coupling means 37 can be a capacitive element or an inductive element, or a combination thereof.

Another implementation is shown in FIG. 9 which incorporates a grounded screen element 40 that is disposed between the auxiliary coupling means 37 and the furnace coil 2. The blocking elements 38 and 39 and the ground shield 40 effectively prevent RF energy from being inductively coupled to the furnace coil 2.

If an RF tuning system is used, the changes in the coupling element/electrical parameters may cause inefficient power matching unless readjustments are made. One solution to this problem is to adjust the RF generator frequency to maintain power into the load. An automatic control may be incorporated for this purpose. Other methods, such as varying the capacitance or inductance are readily conceivable to those skilled in the art.

When the furnace coil is used as the coupling element, the operation of the cleaning system is also aided by performing the clean cycle with the furnace at a temperature in excess of 600° C., which is the case for normal operation of polysilicon and silicon nitride LPCVD systems. The furnace coil in most systems is made of Kanthal, a ferrous alloy. The magnetic susceptibility of such an alloy enhances the resistive loss in the coil due to the "skin effect", thus much RF power is lost in the coil itself. This effect is significant even below 100 kHz in Kanthal. Furthermore, the coil's inductance becomes freuqency and thermal history dependent, making it not reliable or reproducible as an Rf circuit element. These problems can be overcome by operating the coil material at a temperature significantly above its Curie temperature at which magnetic susceptibility drops to a much lower value allowing reliable operation without excessive power losses. By cleaning at such temperature no time is lost for furnace cooling and subsequent reestablishment of the process temperature.

When the apparatus employs auxiliary coil or capacitor electrode coupling elements, the temperature limitations are negated and the coupling of RF energy becomes independent of the furnace operating temperature.

Another RF power supply variable is the RF power level. The cleaning rate can be expected to increase as the RF power is increased, eventually saturating at a level dependent on the reactive gas species, partial pressure and the vacuum system's pumping speed.

Figure 3:
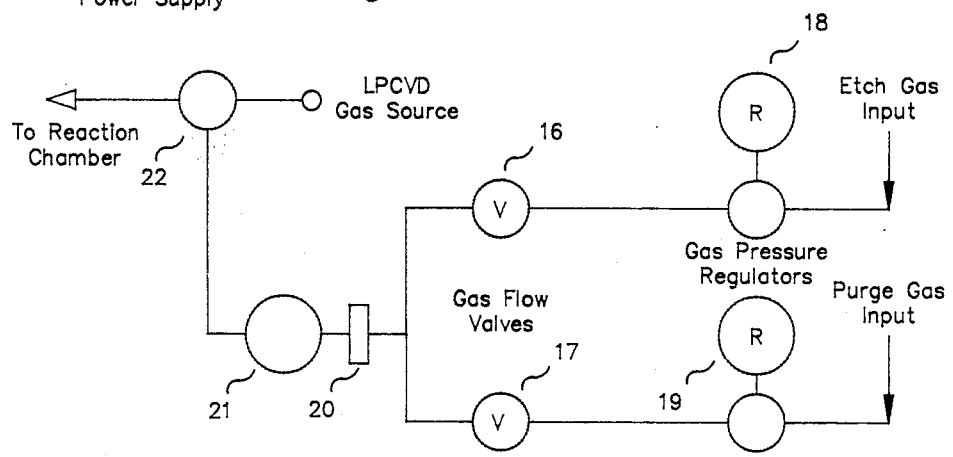
FIG. 3 is a schematic diagram depicting the gas control unit elements.

FIG. 3 shows the gas control unit schematic. Gas flow control valves 16 and 17 are provided which are manually or electrically activated. The function of these valves is to select any combination of etchant or purge gases. Pressure regulators and gauges 18 and 19 allow the pressure of each incoming gas to be adjusted and monitored. A gas filter 20, normally rated at a 0.2u particulate level, prevents particulate contamination from the gas and gas tubing from entering the reaction chamber. A gas flow control element 21, which may be a conventional flow meter, a fixed orifice flow controller or a mass flow control unit, allows the adjustment and monitoring of the gas flow into the reaction chamber.

A valve 22 is used to select either cleaning/purging gases or the normal LPCVD gases to enter the reaction chamber. This valve isolates the reaction chamber from the gases used in the normal CVD process in one position and from the cleaning/purging gases in the other position. This valve can also be manually or electrically operated.

Figure 4:
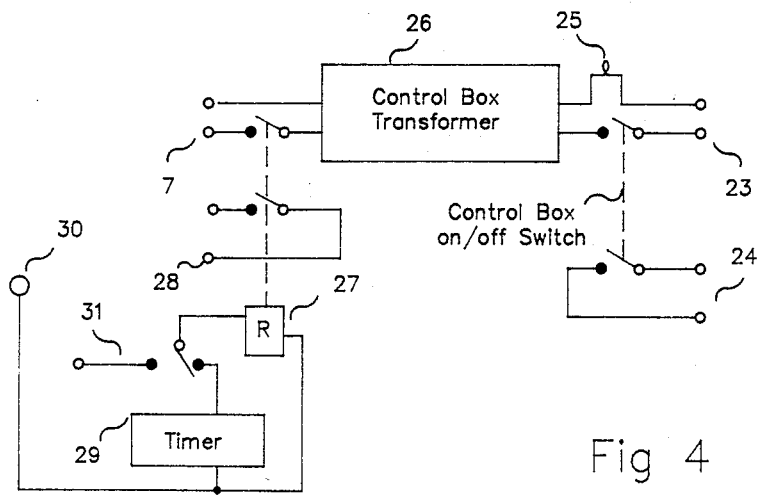
FIG. 4 is a schematic diagram of an electrical configuration for the master control module of the apparatus, made in accordance with this invention.

FIG. 4 shows an example of the electrical schematic for the master control module. Electrical power supply terminals 23 and 24 provide inputs to the master control module and the RF power source, respectively. An on/off light 25 indicates whether power supplies are on or off. A control box transformer 26 generates the voltages required to operate any electrically controlled valves in the gas control unit 7. The output power of this transformer is controlled by a relay switch 27, as is the output of the RF generator 28. The relay switch is controlled by an electrical signal provided from either a timer 29, or an end of process monitor 30. The selection of end-point or timer signal control is accomplished by the manual local/remote switch 31.

The sequence of events in the performance of the tube cleaning operation are as follows:

(1) Turn on main power to the master control unit and RF power supplies. This action also activates the valve isolating the LPCVD gases and connects the cleaning gas lines to the reaction tube.

(2) Select end-point or timer control on the master control unit.

(3) Load the LPCVD water boat and close the LPCVD chamber door.

(4) Activate the LPCVD system's vacuum pump and evacute the reaction tube. (Alternatively, this may be automatically activated by the LPCVD system door closure mechanism.)

(5) When a predefined base pressure, typically 10 mT, has been achieved, a signal turns on the valve to allow a predefined flow of the reactant gas to enter the reaction tube. Typical operating pressures for the cleaning process are from a few hundred to a few thousand milli Torr. The RF power supply is then automatically activated and a preset RF power level, typically 500–3000 watts, is coupled into the coupling element. Alternatively, when the operating pressure is reached, the furnace power is turned off and the RF power turned on.

(6) At the end of a predefined time, or upon receiving a clean completion signal from the end of process detector, the RF power output is turned off and the gas input switched from the cleaning gas to the purge gas. In the implementation in which the furnace power has been turned off, it would be reconnected at this time allowing the process temperature to be reestablished during the final stages of the clean cycle.

(7) After a predefined time the purge gas is turned off and the system vented to atmosphere.

(8) Finally, the main switch on the master control module is turned off thereby disconnecting power to the control module and the RF power supplies and reconnecting the rection tube to the LPCVD gas supplies.

A further advantage is realized in an embodiment of this invention in which either or both the cleaning gas and RF power are multiplexed through a gas flow and electrical switching network to provide a cleaning service to any number of LPCVD tubes in the same furnace bank with multiple tuning or individual capacitor tuning.

The fact that the cleaning station is an integral part of the LPCVD furnace system makes it practical to clean the furnace quartzware between every deposition run in which case it is anticipated that the total clean cycle time would be less than 10 minutes.

While various reactive gases could be used for the cleaning process $NF_3$ is favored for polysilicon and silicon nitride removal due to its high etch rate, its good selectivity over quartz and its freedom from carbon byproducts. Alternatively, other gases or gas mixtures may be used to remove these or other materials deposited in furnace LPCVD systems.

The cleaning system of this invention can be adapted to clean other types of LPCVD reaction chambers, provided an inductive or capacitive element exists around the furnace chamber to facilitate coupling RF energy into cleaning gases contained within the chamber.

We claim:

1. An apparatus for cleaning a low pressure chemical vapor deposition furnace by plasma etching without the use of auxiliary heating comprising:
 a furnace tube;
 means for supplying operating power to said tube;
 a coil for inductively coupling radio frequency energy to said tube;
 means for supplying a purging gas through the interior of said tube;
 a radio frequency power supply couplied to said coil for creating a gas plasma within said tube; and
 means for effectively isolating said radio frequency power supply from said operating power supplying means;
 whereby low pressure chemical vapor deposited films that have accumulated on the surfaces of said tube are removed.

2. An apparatus as in claim 1, including means for adjusting the frequency of said radio frequency power supply to effectively couple said radio frequency power supply to said coil and to tune said radio frequency power supply with said coil.

3. An apparatus as in claim 1, including means for operating said coil so that the clean cycle is maintained at a temperature in excess of the Curie temperature of the coil material whereby radio frequency losses of the furnace coil are reduced.

4. An apparatus as in claim 3, wherein the operating temperature of said apparatus during a clean cycle is greater than 600° C.

5. An apparatus as in claim 1, wherein said gas plasma consists essentially of $NF_3$.

6. An apparatus as in claim 1, wherein said apparatus is operated at a pressure of about 1-2 Torr and at a power level of radio frequency energy in a range of about 500-3000 watts that is coupled to said coil.

7. An apparatus for cleaning a low pressure chemical vapor deposition furnace by plasma etching without the use of auxiliary heating comprising:
 a furnace tube;
 means for supplying operating power to said tube;
 a coil for inductively coupling radio frequency energy to said tube;
 means for supplying a purging gas through the interior of said tube;
 a radio frequency power supply coupled to said coil for creating a gas plasma within said tube; and
 means for effectively isolating said radio frequency power supply from said operating power supplying means;
 wherein said isolating means comprises a capacitive-inductive network;
 whereby low pressure chemical vapor deposited films that have accumulated on the surfaces of said tube are removed.

8. An apparatus as in claim 7, including means for adjusting the frequency of said capacitive-inductive network to effectively couple said radio frequency power supply to said coil so that said radio frequency power supply is resonant with said coil.

9. An apparatus for cleaning a low pressure chemical vapor deposition furnace by plasma etching without the use of auxiliary heating comprising:
 a furnace tube;
 means for supplying operating power to said tube;
 a coil for inductively coupling radio frequency energy to said tube;
 means for supplying a purging gas through the interior of said tube;
 a radio frequency power supply coupled to said coil for creating a gas plasma within said tube; and
 means for effectively isolating said radio frequency power supply from said operating power supplying means;
 wherein said isolating means comprises electrically activated relays;
 whereby low pressure chemical vapor deposited films that have been accumulated on the surfaces of said tube are removed.

10. An apparatus for cleaning a low pressure chemical vapor deposition furnace by plasma etching without the use of auxiliary heating comprising:
 a furnace tube;
 means for supplying operating power to said tube;
 a coil for inductively coupling radio frequency energy to said tube;
 means for supplying a purging gas through the interior of said tube;
 a radio of frequency power supply coupled to said coil for creating a gas plasma within said tube; and
 means for effectively isolating said radio frequency power supply from said operating power supplying means,
 wherein said isolating means comprises a transformer and swtiching arrangement;
 whereby low pressure chemical vapor deposited films that have been accumulated on the surfaces of said tube are removed.

11. An apparatus for cleaning a low pressure chemical vapor deposition furnace by plasma etching compmrising:
 a furnace tube;
 means for supplying operating power to said furnace tube;
 a furnace coil coupled to said furnace tube power supplying means and mounted around said tube;
 a first auxiliary coupling means disposed between said furnace coil and said furnace tube;
 means for supplying radio frequency power;
 means for supplying an etchant gas to the interior of said furnace tube; and
 a second auxiliary coupling means coupled between said first auxiliary coupling means and said radio frequency power supplying means,
 whereby radio frequency power is effectively resonated with said first auxiliary coupling means.

12. An apparatus as in claim 11, wherein said first auxiliary coupling element comprises an inductive coil, and said second auxiliary coupling element comprises a capacitive element.

13. An apparatus as in claim 11, wherein said first auxiliary coupling element comprises a capacitive electrode and said second auxiliary coupling element comprises an inductive element.

14. An apparatus for cleaning a low pressure chemical vapor deposition furnace by plasma etching comprising:
 a furnace tube;
 means for supplying operating power to said furnace tube;
 a furnace coil coupled to said furnace tube power supplying means and mounted around said tube;
 an auxiliary coupling means disposed between said furnace coil and said furnace tube;

means for supplying radio frequency, said radio frequency power supplying means being coupled to said auxiliary coupling means power;

means for supplying an etchant gas to the interior of said furnace tube; and an auxiliary isolating means coupled between said furnace coil and said furnace power supply, whereby furnace power supply is effectively isolated from radio frequency energy induced into the furnace coil from said auxiliary coupling means.

15. An apparatus as in claim 14 wherein said auxiliary isolating means comprises an inductive coil.

16. An apparatus as in claim 14, wherein said auxiliary isolating means comprises a switching element.

17. An apparatus as in claim 14, wherein said auxiliary isolating means comprises a ground shield disposed between said furnace coil and said auxiliary coupling means.

* * * * *

UNITED STATES PATENT AND TRADEMARK OFFICE
CERTIFICATE OF CORRECTION

PATENT NO. : 4,795,880

DATED : January 3, 1989

INVENTOR(S) : Hayes et al.

It is certified that error appears in the above-identified patent and that said Letters Patent is hereby corrected as shown below:

Please add Figs. 5-9 which are attached hereto.

On first sheet of drawings "Sheet 1 of 2" should read --Sheet 1 of 4--.

On second sheet of drawings "Sheet 2 of 2" should read --Sheet 2 of 4--.

Signed and Sealed this

Fourth Day of July, 1989

Attest:

DONALD J. QUIGG

*Attesting Officer*  *Commissioner of Patents and Trademarks*